United States Patent
Jacob

(10) Patent No.: US 10,326,482 B2
(45) Date of Patent: Jun. 18, 2019

(54) LINEARIZATION OF A RADIOFREQUENCY-SIGNAL TRANSMISSION CHAIN

(71) Applicant: STMicroelectronics (Alps) SAS, Grenoble (FR)

(72) Inventor: Herve Jacob, Voreppe (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 16/003,623

(22) Filed: Jun. 8, 2018

(65) Prior Publication Data

US 2018/0367171 A1 Dec. 20, 2018

(30) Foreign Application Priority Data

Jun. 14, 2017 (FR) .................... 17 55344

(51) Int. Cl.
*H04K 1/02* (2006.01)
*H04B 1/04* (2006.01)
(Continued)

(52) U.S. Cl.
CPC .............. *H04B 1/04* (2013.01); *H03F 1/223* (2013.01); *H03F 1/3247* (2013.01); *H03F 3/195* (2013.01); *H03F 3/245* (2013.01); *H03F 3/45376* (2013.01); *H03F 2200/204* (2013.01); *H03F 2200/207* (2013.01); *H03F 2200/534* (2013.01); *H03F 2200/537* (2013.01); *H03F 2200/555* (2013.01); *H03F 2203/45394* (2013.01); *H03F 2203/45544* (2013.01);
(Continued)

(58) Field of Classification Search
CPC ... H04B 1/04; H04B 2001/0425; H03F 1/223; H03F 3/45376; H03F 3/245; H03F 3/195; H03F 1/3247; H03F 2203/45394; H03F 2200/555; H03F 2200/537; H03F 2200/534; H03F 2200/207; H03F 2200/204; H03F 2203/45604; H03F 2203/45594; H03F 2203/45548; H03F 2203/45544
USPC ....... 375/219, 224, 260, 267, 295, 296, 297, 375/316; 455/114.2, 114.3, 127.1; 330/2, 103, 149, 291
See application file for complete search history.

(56) References Cited

U.S. PATENT DOCUMENTS

| 8,706,062 B1 | 4/2014 | Yu et al. |
| 9,240,761 B1 | 1/2016 | Reyland, Jr. |
| 2002/0085647 A1 | 7/2002 | Oishi et al. |

OTHER PUBLICATIONS

INPI Search Report and Written Opinion for FR 1755344 dated Feb. 8, 2018 (6 pages).

*Primary Examiner* — Dhaval V Patel
(74) *Attorney, Agent, or Firm* — Crowe & Dunlevy

(57) ABSTRACT

A transmission chain receives an incident signal to be transmitted having a first power and a first bandwidth. A first modulator frequency shifts a first signal derived from the incident signal to generate a first shifted signal at a modulation output. A power amplifier coupled to the modulation output amplifies an intermediate signal to generate an amplified output signal. A predistortion-signal-generating circuit generates, from the incident signal and from the amplified output signal in a second bandwidth that is larger than the first bandwidth, a predistortion signal having a second power lower than the first power. A second modulator frequency shifts a second signal derived from the predistortion signal to generate a second shifted signal for combination with the first shifted signal at said modulation output to produce the intermediate signal.

27 Claims, 5 Drawing Sheets

(51) Int. Cl.
  *H03F 1/22*    (2006.01)
  *H03F 1/32*    (2006.01)
  *H03F 3/195*   (2006.01)
  *H03F 3/24*    (2006.01)
  *H03F 3/45*    (2006.01)
(52) U.S. Cl.
  CPC .............. *H03F 2203/45548* (2013.01); *H03F 2203/45594* (2013.01); *H03F 2203/45604* (2013.01); *H04B 2001/0425* (2013.01)

LINEARIZATION OF A RADIOFREQUENCY-SIGNAL TRANSMISSION CHAIN

PRIORITY CLAIM

This application claims the priority benefit of French Application for Patent No. 1755344, filed on Jun. 14, 2017, the content of which is hereby incorporated by reference in its entirety to the maximum extent allowable by law.

TECHNICAL FIELD

Embodiments and implementations of the invention relate to the transmission of signals, especially radiofrequency signals, and in particular to the linearization by predistortion of a radiofrequency-signal transmission chain.

BACKGROUND

Linearization of a transmission chain in particular includes correcting deformation of the signal output from the chain.

Radiofrequency-domain power amplifiers normally generate distortions because they have non-linear responses. Applying compensation in power amplifiers introduces many constraints.

For example, the cost of technologies providing a satisfactory linearity, such as technologies produced on gallium arsenide (GaAs) substrates, is very high. Overspecing the amplifier, in a class-A design for example, increases the required supply current and means larger power modules are required, thermodynamic constraints appear, etc. However, this is incompatible with low consumption technologies, such as mobile telephones.

Furthermore, it is difficult to obtain a satisfactory linearity in high-modulation-order systems, in which the "peak to average" ratio of the emitted signals may be more than 10 dB, while maintaining a satisfactory efficiency in the transmission chain and the power amplifier. However, this is essential, in particular in terrestrial hertzian-wave emitter technologies.

Any nonlinearity limits the quality of service, for example in terms of data rate and bit error rate.

Furthermore, existing devices for predistorting the incident signal have limitations because of the need to associate a wide passband and a high incident-signal power.

FIG. 1 illustrates an example of a transmission chain DIS0 including a conventional predistortion device.

A digital block PR generates an incident baseband signal BBIN intended to be emitted over an antenna ANT at the end of the chain. The incident signal BBIN undergoes initial signal-shaping digital filtering in an input module TxDFE.

A digital predistortion module DPD generates and applies, to the incident signal BBIN, a predistortion signal depending on the incident signal BBIN and on the output signal RFOUT expected to be output from the chain.

The predistortion signal allows, by anticipation, deformation of the incident signal during its passage through the transmission chain to be compensated. Generally, the distortion in particular occurs in a power amplifier PA coupled to the antenna ANT.

The pre-distorted baseband digital signal is converted into an analog signal by a digital-to-analog converter CNA, then shifted by a radiofrequency modulator RFMOD, in particular by means of a mixer and a frequency shift signal LO generated by a local oscillator LOGEN.

The shifted signal is then amplified by the power amplifier PA and emitted by the antenna ANT.

A portion of the emitted signal is returned by a coupler CPL to a radiofrequency demodulator RFDEMOD using the same frequency shift signal LO, then converted into a digital signal by an analog-to-digital converter CAN, and transmitted to the digital predistortion block DPD.

There are various methods allowing the predistortion signal to be calculated, for example methods in which the "ideal" incident signal input into the chain and the distorted signal are compared by way of a look-up table.

Generally, these correction methods are limited to third-order modulation harmonics.

Fifth-order polynomial modelling methods also exist, in which an immediate error correction, obtained by comparing in real-time the emitted signal and the "ideal" signal, is applied.

However, the fifth order is not compatible with wideband channels, for example the channels of 56 MHz and 112 MHz widths of terrestrial hertzian-wave emitters.

Other linearization methods not necessarily requiring knowledge of the "ideal" signal input into the chain also exist. They require the stage upstream of the power amplifier PA, and in particular the modulator RFMOD, to have an excellent linearity.

In these types of correction methods and generally in conventional devices, the linearity correction is applied in the baseband domain and transmitted to the modulator via the digital-to-analog converter CNA.

Thus, the digital-to-analog converter CNA and the modulator RFMOD must at the same time meet the constraints of high bandwidth (to contain the spectrum of the predistortion signal) and of high power (the modulator RFMOD must be high-power to meet the needs of the transmission of the incident signal).

Therefore, the digital-to-analog converter CNA must have a high sampling frequency and a high input dynamic range. A high input dynamic range requires many unitary digital-to-analog conversion cells and therefore introduces substantial bulk.

Likewise, since the modulator RFMOD is driven by the pre-distorted signal, it operates at the power of the incident signal (i.e. several tens of decibels) and at the bandwidth of the predistortion signal (i.e. about three to five times the bandwidth of the incident signal).

However, it is problematic to achieve the bandwidth of the predistortion signal in the radiofrequency domain with large transistors.

Furthermore, it is desirable to produce transmission chain devices having a very good linearity while avoiding designs on gallium-arsenide substrates, in particular for reasons of production cost.

SUMMARY

According to one aspect, a method is proposed for processing an incident signal having a first power and a first bandwidth, including an amplification of an intermediate signal delivering an amplified output signal. The method comprises: generating a shift signal; first shifting of the frequency of a first signal issued from the incident signal using the shift signal so as to generate a first shifted signal; generating a predistortion signal having a second power lower than the first power and a second bandwidth larger than the first bandwidth, from the incident signal and the amplified output signal; second shifting the frequency of a second signal issued from the predistortion signal using the shift signal so as to generate a second shifted signal; and summing the first shifted signal and the second shifted signal so as to form the intermediate signal.

In other words, the first frequency shift is adapted to the power constraints of the incident signal, without being subject to the bandwidth constraints of the predistortion signal, and the second frequency shift is adapted to the bandwidth constraints of the predistortion signal, without being subject to the power constraints of the incident signal.

Since said constraints are not cumulative, this method for processing an incident digital signal allows transmission-chain optimization, in particular in terms of production cost, bulk and performance.

According to one implementation in which the incident signal is a digital signal and the predistortion signal is a digital signal, the method further comprises: first digital-to-analog converting the digital incident signal delivering the first signal, the digital-to-analog converting having a first input dynamic range and a first sampling frequency; and a second digital-to-analog converting of the digital predistortion signal delivering the second signal, the second digital-to-analog converting having a second input dynamic range lower than the first input dynamic range and a second sampling frequency higher than the first sampling frequency.

According to one implementation, the generation of the predistortion signal comprises a downshift of the frequency of the amplified output signal, which downshift is carried out using the shift signal, and an analog-to-digital converting of the shifted amplified output signal.

The predistortion signal is advantageously generated so that it compensates for a distortion of the amplified output signal with respect to the incident signal.

The predistortion signal is for example determined by automatic learning.

The predistortion signal is for example generated in real time and includes a correction of the difference between the incident signal and the output signal.

Advantageously, the first shifting comprises a first pre-amplification generating the first shifted signal as a current signal, and the second shifting comprises a second pre-amplification generating the second shifted signal as a current signal.

Said first and second pre-amplifications may be implemented with controllable respective gains and controllable respective bandwidths.

For example, the second power is 100 to 1000 times lower than the first power.

For example, the second bandwidth is 3 to 5 times larger than the first bandwidth.

Advantageously, said incident signal and said predistortion signal are quadrature signals having an amplitude modulated at at least ten bits per symbol.

Advantageously, the shift signal is a radiofrequency signal.

According to another aspect, a transmission chain device comprises: a signal input for receiving an incident signal to be transmitted having a first power and a first bandwidth; a local oscillator module configured to generate a shift signal; a first modulator configured to perform a first frequency shift on a first signal issued from the incident signal using the shift signal, so as to deliver a first shifted signal to a modulation output; a power amplifier including an input coupled to the modulation output, the power amplifier being configured to amplify an intermediate signal on the modulation circuit output and to deliver an amplified output signal; a predistortion-signal-generating circuit configured to generate, from the incident signal and from the output signal, a predistortion signal having a second power lower than the first power and a second bandwidth that is larger than the first bandwidth; a second modulator configured to perform a second frequency shift on a second signal issued from the predistortion signal using the shift signal, so as to deliver a second shifted signal to said modulation output, forming, with the first shifted signal, the intermediate signal.

Likewise, by avoiding cumulation of the respective power and passband constraints of the incident signal and the predistortion signal, this device in particular allows transmission-chain production cost, bulk and performance to be optimized.

According to one embodiment, in which the incident signal is a digital signal and the predistortion-signal-generating circuit is configured to generate a digital predistortion signal, the device further includes: a first digital-to-analog converter configured to deliver, from the digital incident signal, the first signal to the first modulator, the first digital-to-analog converter having a first input dynamic range and a first sampling frequency; and a second digital-to-analog converter configured to deliver, from the digital predistortion signal, the second signal to the second modulator, the second digital-to-analog converter having a second input dynamic range smaller than the first input dynamic range and a second sampling frequency higher than the first sampling frequency.

The device may furthermore include a demodulator configured to downshift the frequency of the amplified output signal using the shift signal, and an analog-to-digital converter configured to deliver a digital signal from the shifted amplified output signal.

Advantageously, the predistortion-signal-generating circuit is configured to generate said predistortion signal so that it compensates for a distortion of the amplified output signal with respect to the incident signal.

According to one embodiment, the predistortion-signal-generating circuit includes a processor or computing circuit configured to determine by automatic learning the predistortion signal and a signal generator configured to generate the determined predistortion signal.

According to one embodiment, the predistortion-signal-generating circuit includes a feedback loop configured to generate in real-time a correction of the difference between the incident signal and the output signal.

Advantageously, the first modulator includes a first mixer and a first buffer amplifier generating the first shifted signal as a current signal on the modulation output, and the second modulator includes a second mixer and a second buffer amplifier generating the second shifted signal as a current signal on the modulation output.

Said first and second buffer amplifiers may respectively each include a plurality of first and second elementary buffer amplifiers that are switchable in parallel on command, switching control signals allowing the value of the gain and the bandwidth of the respective modulator to be controlled.

For example, the second power is 100 to 1000 times lower than the first power.

For example, the second bandwidth is 3 to 5 times larger than the first bandwidth.

For example, said incident signal and said predistortion signal are quadrature signals and have an amplitude modulated at at least ten bits per symbol.

Advantageously, the shift signal is a radiofrequency signal.

The device is advantageously produced in an integrated way in and on a silicon-germanium substrate.

The modulation output may comprise a three-winding transformer, a first primary winding of which is intended to receive the first shifted signal, a second primary winding of which is intended to receive the second shifted signal, and a secondary winding of which is intended to deliver said intermediate signal.

A radiofrequency-signal transmission system, such as a mobile phone, a unit of a backhaul network or a satellite, is also proposed, said system including a transmission chain device such as defined above, a digital device able to generate said incident signal on said signal input, and an antenna coupled to the output of said power amplifier.

BRIEF DESCRIPTION OF THE DRAWINGS

Other advantages and features of the invention will become apparent on examining the detailed description of completely nonlimiting embodiments and implementations and the appended drawings, in which.

DETAILED DESCRIPTION

Figure 1:
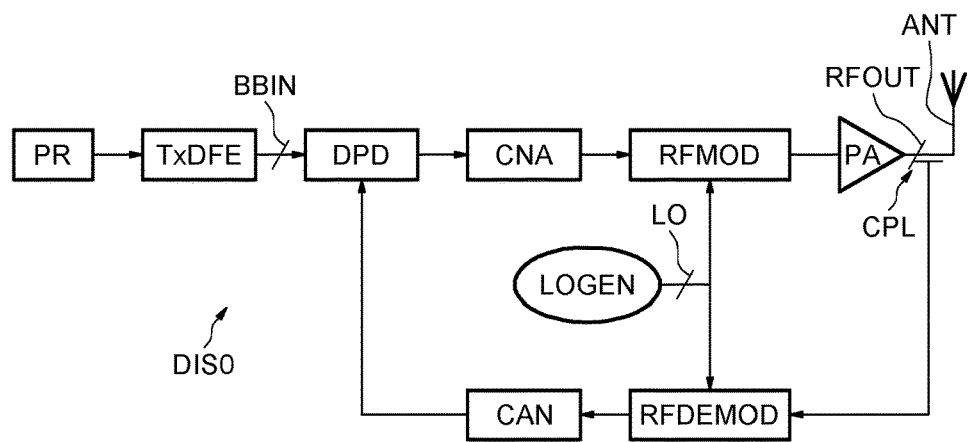
FIG. 1, which was described above, schematically illustrates a transmission chain comprising a conventional predistortion device.
Figure 2:
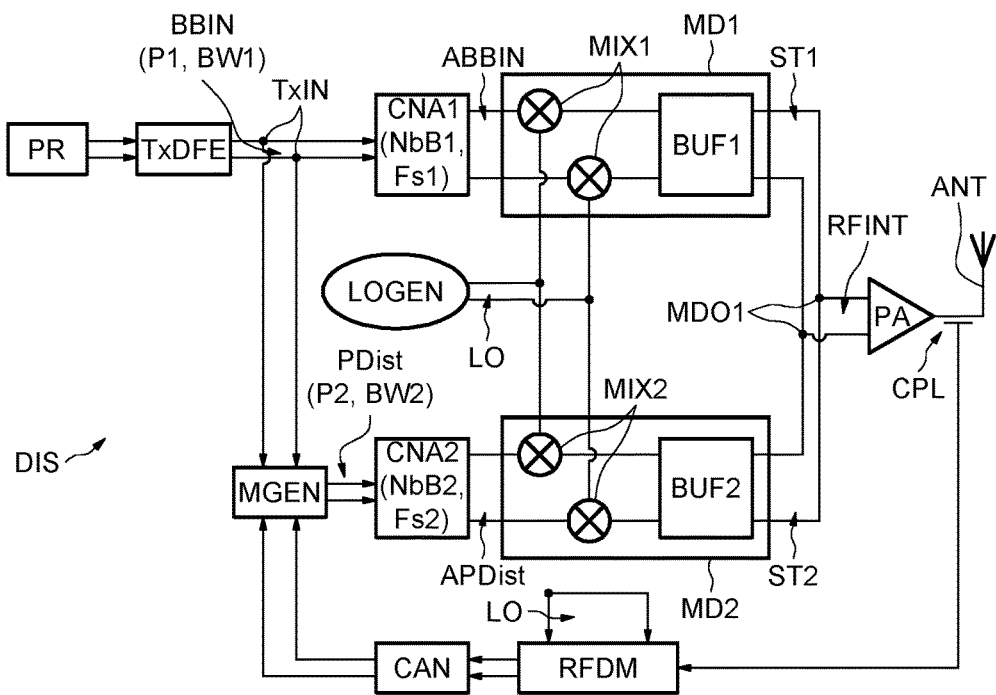
FIGS. 2 and 3 illustrate example transmission chain devices.

FIG. 2 shows an example transmission chain device DIS including a signal input TxIN on which an incident digital signal BBIN is generated.

The device DIS is, for example, produced in an integrated way in and on a silicon-germanium (SiGe) substrate.

The incident signal BBIN is generated in a baseband by a digital block PR, for example a baseband processor, and is shaped by a digital signal-shaping module TxDFE.

The transmission chain is divided into two parallel modulation circuits MD1, MD2.

The incident signal BBIN is a quadrature amplitude modulation (QAM) signal that is transmitted conjointly over an in-phase channel and a quadrature channel.

The first modulation circuit MD1 is intended to shift and pre-amplify a first signal ABBIN issued from the incident signal BBIN at a first power P1 and in a first bandwidth BW1, so as to form a first shifted signal ST1. For example, the power may be increased by 15 dB to 30 dB during the shift and the bandwidth may be comprised between 1.4 MHz and 20 MHz in mobile devices, and a few hundred megahertz in hertzian-wave stations such as backhaul network units.

The second modulation circuit MD2 is intended to shift and pre-amplify a second signal APDist issued from a predistortion signal PDist having a second power P2 and a second bandwidth BW2, so as to form a second shifted signal ST2. The second power P2 is lower than the first power P1, and the second bandwidth BW2 is larger than the first bandwidth BW1.

In this example, and as detailed below, the first signal ABBIN is issued from a digital-to-analog conversion of the incident signal BBIN, and the second signal APDist is issued from a digital-to-analog conversion of a predistortion signal PDist.

The first shifted signal ST1 and the second shifted signal ST2 are added at a modulation circuit output MD01 to form an intermediate signal RFINT.

The intermediate signal RFINT is the signal intended to be amplified by a power amplifier PA at the end of the chain, in order to be emitted by an antenna ANT.

The modulation circuit output MD01 is common to the first modulation circuit MD1 and to the second modulation circuit MD2, the current flows of the signals being summed via a parallel connection.

A first digital-to-analog converter CNA1 is connected to the inputs of the first modulation circuit MD1.

The first digital-to-analog converter CNA1 has a first input dynamic range NbB1 and a first sampling frequency Fs1.

The input dynamic range corresponds to the number of bits on which the incident digital signal is coded. Thus, for a 1024QAM modulation (i.e. a 1024-symbol quadrature amplitude modulation, i.e. 10 bits per symbol) a first input dynamic range NbB1 of 14 bits allows emission with a good level of noise and of linearity.

The first sampling frequency Fs1 may, in contrast, be relatively low, for example 4 times the radiofrequency emission band.

The first digital-to-analog converter CNA1 receives the incident signal BBIN on its input and converts it into an analog incident signal called the first signal ABBIN.

The first modulation circuit MD1 includes a first mixer (MIX1) and a first buffer amplifier (BUF1).

The mixer (MIX1) allows the first signal ABBIN, which initially is in the baseband, or intermediate band, to be shifted to the carrier frequency.

A shift signal LO at the carrier frequency is generated by a local oscillator LOGEN.

The local oscillator LOGEN may include, as is conventional and known per se, a signal-generating oscillator circuit such as a resonator or a phase locked loop.

The buffer amplifier BUF1 allows, on the one hand, a pre-amplification gain to be applied to the first shifted signal ABBIN, and, on the other hand, for example, the modulation circuit to be isolated from a reverse transmission originating from the output, via for example a cascode configuration.

The incident signal BBIN is converted analogously into a first signal ABBIN, and thus shifted and pre-amplified by the first modulation circuit MD1 to form a first shifted signal ST1 intended to be applied to an input PAin of the power amplifier PA.

Predistortion-signal-generating circuit MGEN is configured to model and generate the predistortion signal PDist, followed by a second digital-to-analog converter CNA2, are connected to the inputs of the second modulation circuit MD2.

The predistortion-signal-generating circuit MGEN includes a processor or computing circuit CLC intended to model a function allowing, by anticipation, a distortion of the incident signal BBIN, which distortion is in particular caused by the first modulation circuit MD1 and the power amplifier PA, to be compensated.

The predistortion-signal-generating circuit MGEN furthermore includes a digital-signal generator GEN allowing the predistortion signal PDist, having the second power P2 and of the second bandwidth BW2, to be generated.

The amplified output signal RFOUT, present on the output of the power amplifier PA, is delivered to the predistortion-signal-generating circuit MGEN via a directional coupler CPL. This output signal RFOUT is downshifted, for example to the baseband, by a demodulator RFDM that receives the modulation signal, which is generated by the same local oscillator LOGEN. The signal shifted to the baseband is then converted into a digital signal by an analog-to-digital converter CAN.

For example, the processor or computing circuit CLC is configured to compute, using an automatic-learning technique, a digital predistortion signal, relatively to a correction model. The correction model is, for example, issued from a function or a table of references. The automatic learning, for example, consists in adjusting the correction depending on its actual effect, this actual effect possibly for example depending on temperature and power-supply conditions.

According to another example, the predistortion-signal-generating circuit is configured to counteract in real-time an error in the output signal RFOUT with respect to the incident signal BBIN.

The digital signal generator GEN thus generates the predistortion signal PDist.

Since the second power P2 corresponds to the (generally low) power of the distortion, there is no need for the pre-amplification gain to be higher than about 16 to 20 dB below the first power P1 of the incident signal in the modulation circuit MD1.

The second bandwidth BW2 corresponds to the spectral width of the distortion, generally 3 to 5 times the bandwidth BW1 of the incident signal.

The digital predistortion signal PDist will then be converted into an analog predistortion signal APDist, called the second signal, by the second digital-to-analog converter CNA2, then shifted and pre-amplified by the second modulation circuit MD2, forming a second shifted signal ST2.

The second digital-to-analog converter CNA2 has a second input dynamic range NbB2 and a second sampling frequency Fs2.

The second input dynamic range NbB2 may be relatively low, for example 4 bits less than the first input dynamic range NbB1 given above.

The second sampling frequency Fs2 is, in contrast, relatively high, for example about 3 to 5 times the first sampling frequency Fs1.

Likewise, the second modulation circuit MD2 includes a second mixer (MIX2) and a second buffer amplifier (BUF2).

The mixer MIX2 allows the second signal APDist, which initially is in the baseband, or intermediate band, to be shifted to the carrier frequency.

The modulation signal LO at the carrier frequency is generated by the same local oscillator LOGEN.

The second buffer amplifier BUF2 allows, on the one hand, a pre-amplification gain to be applied to the shifted second signal APDist, and, on the other hand, for example, the modulation circuit to be isolated from a reverse transmission originating from the output, via for example a cascode configuration.

The predistortion signal PDist converted analogously into a second signal APDist, and thus shifted and pre-amplified forms a second shifted signal ST2 intended to be applied to an input PAin of the power amplifier PA.

The first and second modulation circuits MD1, MD2 are configured to generate the first and second shifted signals ST1, ST2 as current signals on the output of the buffer amplifiers BUF1, BUF2 that they respectively include.

A parallel connection of the outputs of said buffer amplifiers to a modulation-stage-output node MDO that is common to the first modulation circuit MD1 and to the second modulation circuit MD2 allows the first shifted and pre-amplified signal ST1 and the second shifted and pre-amplified signal ST2 to be added directly.

Figure 3:
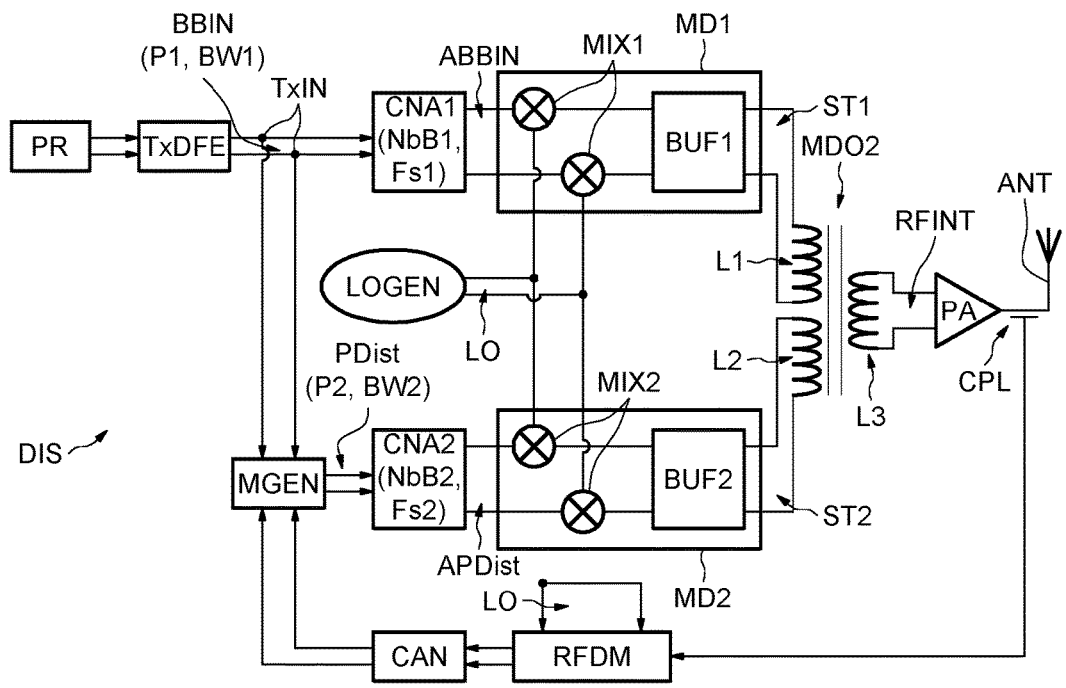

FIG. 3 shows another example embodiment in which the summation of the first shifted signal ST1 and the second shifted signal ST2 is achieved according to another alternative.

In this example, a modulation circuit output MDO2 comprises a three-winding transformer TR, a first primary winding L1 of which is intended to receive the first shifted signal ST1, a second primary winding L2 of which is intended to receive the second shifted signal ST2, and a secondary winding L3 of which is intended to deliver said intermediate signal RFINT. Specifically, in this configuration the intermediate signal RFINT is the sum of the first and second shifted signals TR1, TR2.

All the other elements of the transmission chain device DIS are the same as described above with reference to FIG. 2, are referenced with the same references and are not detailed again here.

Figure 4:
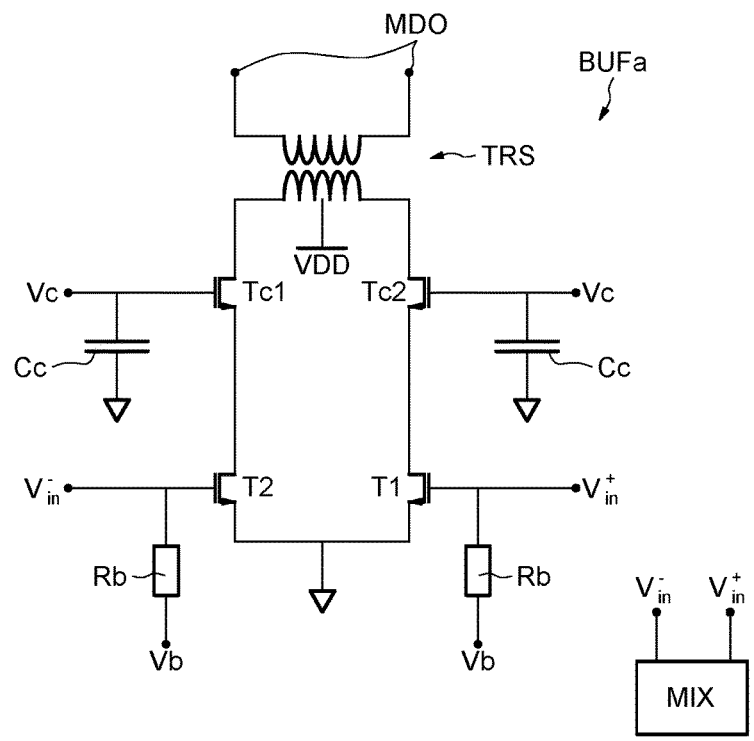
FIGS. 4 and 5 illustrate example buffer amplifiers incorporated into a transmission chain device.

FIG. 4 shows an example buffer amplifier BUFa incorporated into a transmission chain device DIS such as described above with reference to FIGS. 2 and 3.

The buffer amplifier BUFa is a differential-channel amplifier and includes two amplification transistors T1, T2 that are coupled in series with two cascode transistors Tc1, Tc2.

The two cascode transistors Tc1, Tc2 are coupled to differential modulation circuit outputs MDO via an output transformer TRS.

The output terminals MDO of the output transformer TRS are coupled to the inputs of the power amplifier PA.

The cascode transistors Tc1, Tc2 are controlled by a cascode signal applied to a gate node Vc. The cascode signal may for example be such that the reverse isolation figure of merit of the buffer amplifier stage BUF is optimal.

Two inputs Vin+, Vin−, coupled to the gates of the amplification transistors T1, T2, respectively, are intended to receive a differential-mode shifted signal.

The differential-mode shifted signal originates, according to the examples described above with reference to FIGS. 2 and 3, from a mixer MIX1, MIX2.

The mixer MIX1, MIX2 is of conventional structure and is, for example, a Gilbert cell.

The gates of the amplification transistors T1, T2 are moreover coupled to two bias inputs Vb, via bias resistors Rb. The bias inputs Vb are intended to receive a bias signal.

The bias signal allows the average DC voltage bias of the pair of amplification transistors T1, T2 of the buffer amplifier BUF1, to be set.

This example buffer amplifier BUFa may, in the example devices DIS described above with reference to FIGS. 2 and 3, either, in a first case, play the role of the first buffer amplifier BUF1, if the first modulation circuit MD1 is equipped therewith, or, in a second case, play the role of the second buffer amplifier BUF2, if the second modulation circuit MD2 is equipped therewith.

Thus, the differential inputs Vin+, Vin− may receive the first signal ABBIN shifted to the carrier frequency LO in the first case, or the second signal APDist shifted to the carrier frequency LO in the second case.

Figure 5:
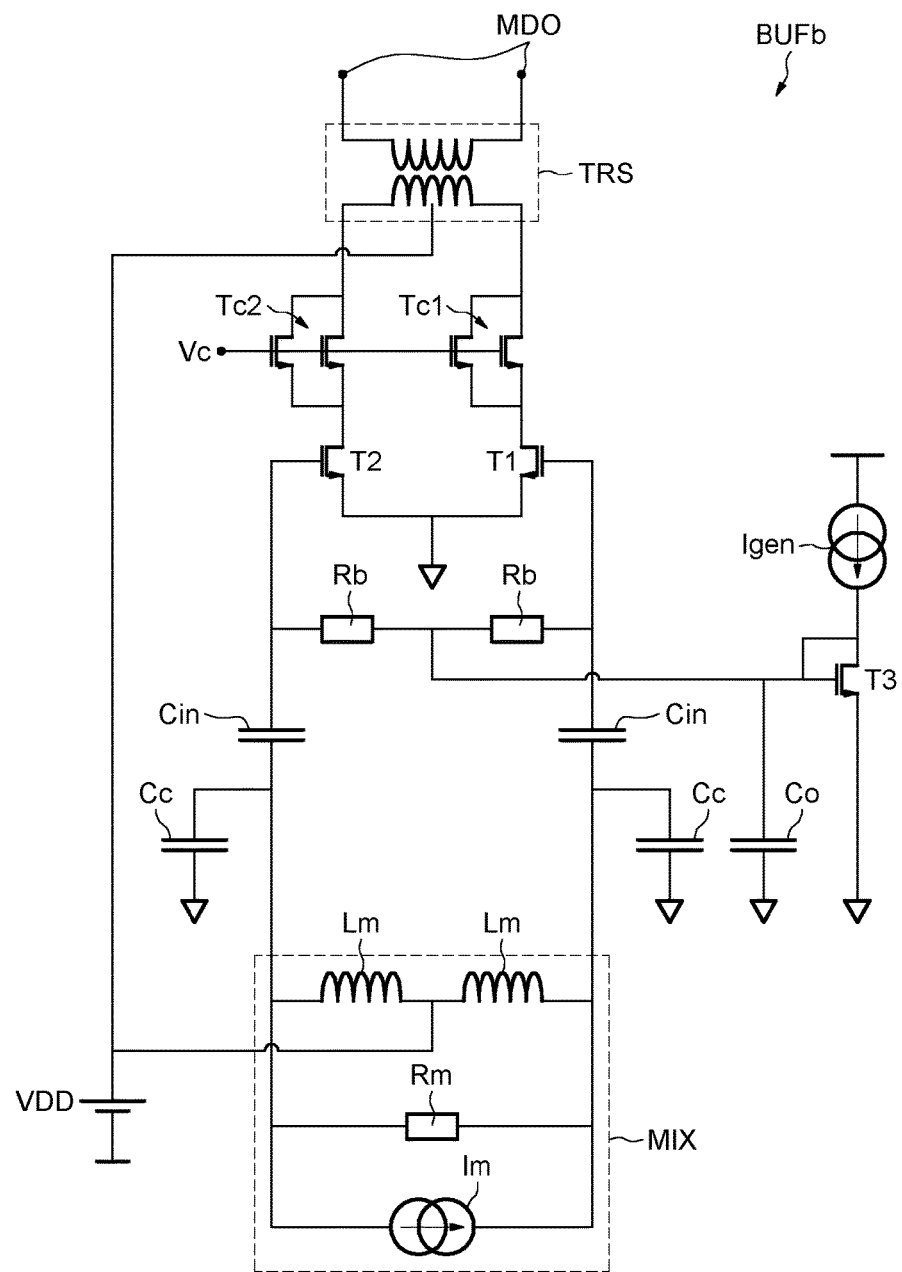

FIG. 5 shows another example buffer amplifier BUFb incorporated into a transmission chain device DIS such as described above with reference to FIGS. 2 and 3.

The buffer amplifier BUFb is of similar architecture to the example described above with reference to FIG. 4 and common elements are referenced with the same references and are not detailed again here.

In this example, the mixer MIX is represented by a current generator Im, illustrating the output signal originating from the mixer, for example the differential currents output from a Gilbert cell.

Decoupling capacitors Cc filter this differential signal, which is applied to the gates of the amplification transistors T1, T2 via respective input capacitors Cin and a parallel arrangement of an inductive element Lm and a resistive element Rm.

Furthermore, a bias current generator Igen makes a current flow through a diode transistor T3.

The gate of the diode transistor T3 is coupled to the gates of the amplification transistors T1, T2 by way of bias resistors Rb, so as to form a current mirror.

A decoupling capacitor Co connected between the gate of the diode transistor T3 and ground allows the control voltage of the current mirror to be filtered.

Control of the current generator Igen, since it is representative of the incident signal, allows the average DC voltage bias of the pair of transistors T1, T2 of the buffer amplifier BUFb to be set.

Likewise, either the first modulation circuit MD1 or the second modulation circuit MD2 may be equipped with this example amplifier BUFb.

Figure 6:
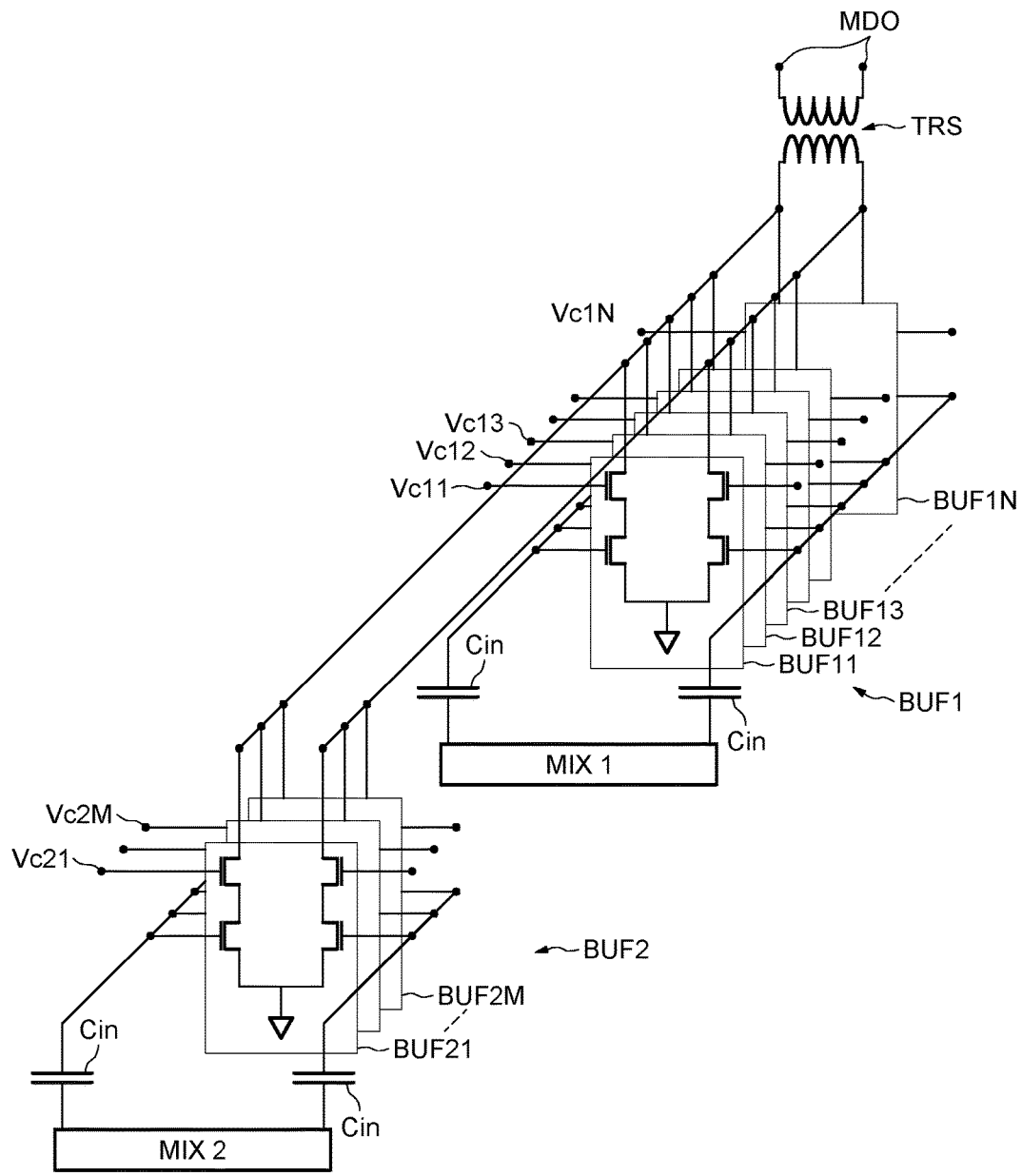
FIG. 6 illustrates a parallel connection of buffer amplifier outputs to a common modulation output node.

FIG. 6 shows an example of parallel connection of the outputs of the first buffer amplifier BUF1 and of the second buffer amplifier BUF2 to a common modulation-stage-output node MDO (in this example by way of an output transformer TRS).

In this example, the first buffer amplifier BUF1 includes a plurality of parallel first elementary buffer amplifiers BUF11-BUF12-. . . -BUF1N.

A first mixer MIX1 transmits the first shifted signal ABBIN to all the first elementary buffer amplifiers.

The first elementary buffer amplifiers BUF11-BUF1N individually have a respective elementary gain and a respective bandwidth.

By bandwidth of an elementary buffer amplifier what is meant is the width of the band of frequencies for which the elementary buffer amplifier transmits the signal at constant amplitude and with a small phase rotation.

The first elementary buffer amplifiers are configured to amplify a signal having a first relatively narrow bandwidth, for example from 1.4 MHz to 20 MHz.

Thus, the control signals Vc11-Vc12-. . . -Vc1N of the cascode transistors of each first elementary buffer amplifier may in particular allow a pre-amplification gain of the first shifted signal ST1 to be adjusted.

Furthermore, control of the respective bias voltages (Vb) of each first elementary buffer amplifier may also allow the pre-amplification gain of the first shifted signal ST1 to be adjusted.

For example, this gain may vary from 15 dB to 30 dB.

The second modulation circuit MD2 includes a plurality of parallel second elementary buffer amplifiers BUF21-. . . -BUF2M.

A second mixer MIX2 transmits the second shifted signal APDist to all the second elementary buffer amplifiers.

Likewise, the second elementary buffer amplifiers BUF21-. . . -BUF2M individually have a respective elementary gain and a respective bandwidth.

The second elementary buffer amplifiers are configured to amplify a signal having a second bandwidth, of the width of the spectrum of the distortion. For example, the bandwidths of the second elementary buffer amplifiers are 3 to 5 times larger than those of the first elementary buffer amplifiers.

Thus, the control signals Vc21-. . . -Vc2M of the cascode transistors of each second elementary buffer amplifier may in particular allow a pre-amplification gain of the second shifted signal ST2 to be adjusted.

Furthermore, control of the respective bias voltages (Vb) of each second elementary buffer amplifier may also, in addition, allow the pre-amplification gain of the second shifted signal ST2 to be adjusted.

For example, in the context of an emission according to the long-term evolution (LTE) 4th-generation mobile telephone standard, the variation in this gain may reach 84 dB if many elementary buffer amplifiers are associated.

In summary, the first modulation circuit is configured and optimized to modulate the incident signal having a first power and a first bandwidth, and the second modulation circuit is configured and optimized to modulate the predistortion signal having a second power, lower than the first power, and a second bandwidth, larger than the first bandwidth. The output currents of the buffer amplifiers incorporated into said modulators are summed on a common modulation-stage-output node MDO, via a parallel connection or a three-winding transformer, the respective passbands and powers having no correlation before said modulation-stage-output node.

The embodiments underlying these absences of correlation between the powers and bandwidths are technically very advantageous, in particular in terms of bulk and production cost.

Furthermore, the example devices described above allow the performance and power consumption of transmission chains to be optimized.

Figure 7:
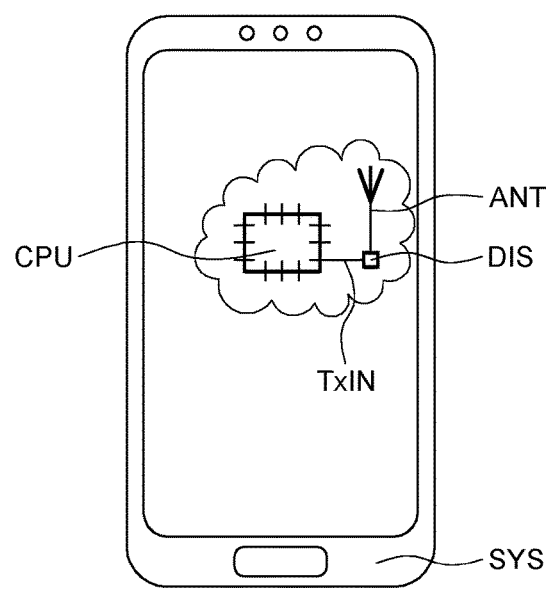
FIG. 7 illustrates a radiofrequency-signal transmission system including a transmission chain device.

FIG. 7 shows a radiofrequency-signal transmission system SYS including a transmission chain device DIS such as described above with reference to FIGS. 2 to 6.

For example, the system SYS may be a mobile telephone, a backhaul network relay antenna or a satellite.

Furthermore, the system SYS includes a digital device CPU that generates the incident signal, which is applied to the signal input TxIN of the device DIS.

An antenna ANT is coupled to the output of the power amplifier PA of the device DIS.

The digital device CPU is, for example, a computational unit such as a microcontroller or a microprocessor. The incident signal is, for example, a quadrature amplitude modulation signal that is modelled by digital sampling and that transmits at least 10 bits per symbol (1024QAM).

Moreover, the invention is not limited to these embodiments but encompasses any variant thereof; for example, the transmission chain devices described with reference to FIGS. 2 and 3 are simplified examples and may in particular include conventional output elements such as filters, a duplexer, a matching network, etc. Likewise, the buffer amplifiers described with reference to FIGS. 4 to 6 may have a different design without departing from the scope of the invention.

The invention claimed is:

1. A method for processing an incident signal having a first power and a first bandwidth, comprising:
   amplifying an intermediate signal to generate an amplified output signal;
   generating a shift signal;
   first shifting a frequency of a first signal generated from the incident signal using the shift signal so as to generate a first shifted signal;
   generating from the incident signal and the amplified output signal a predistortion signal having a second power lower than the first power and a second bandwidth larger than the first bandwidth;

second shifting of a frequency of a second signal generated from the predistortion signal using the shift signal so as to generate a second shifted signal; and summing the first shifted signal and the second shifted signal to generate the intermediate signal.

2. The method according to claim 1, wherein the incident signal is a digital signal and the predistortion signal is a digital signal, the method further comprising:

first digital-to-analog converting the digital incident signal to generate the first signal, wherein the first digital-to-analog converting has a first input dynamic range and a first sampling frequency;

second digital-to-analog converting the digital predistortion signal to generate the second signal, wherein the second digital-to-analog converting has a second input dynamic range lower than the first input dynamic range and a second sampling frequency higher than the first sampling frequency.

3. The method according to claim 2, wherein generating the predistortion signal comprises:

downshifting a frequency of the amplified output signal, wherein said downshifting is carried out using the shift signal, to generate a shifted amplified output signal; and analog-digital converting the shifted amplified output signal.

4. The method according to claim 1, wherein the generated predistortion signal compensates for a distortion of the amplified output signal with respect to the incident signal.

5. The method according to claim 1, further comprising a circuit configured to determine the predistortion signal by automatic learning.

6. The method according to claim 1, wherein the predistortion signal is generated in real time and includes a correction of a difference between the incident signal and the output signal.

7. The method according to claim 1, wherein the first shifting comprises a first pre-amplifying to generate the first shifted signal as a current signal, and the second shifting comprises a second pre-amplifying to generate the second shifted signal as a current signal.

8. The method according to claim 7, wherein said first pre-amplifying and second pre-amplifying are each implemented with controllable respective gains and controllable respective bandwidths.

9. The method according to claim 1, wherein the second power is 100 to 1000 times lower than the first power.

10. The method according to claim 1, wherein the second bandwidth is 3 to 5 times larger than the first bandwidth.

11. The method according to claim 1, wherein said incident signal and said predistortion signal are quadrature signals having an amplitude modulated at at least ten bits per symbol.

12. The method according to claim 1, wherein the shift signal is a radiofrequency signal.

13. A transmission chain device, including:

a signal input configured to receive an incident signal to be transmitted having a first power and a first bandwidth;

a local oscillator configured to generate a shift signal;

a first modulator circuit configured to perform a first frequency shift on a first signal generated from the incident signal using the shift signal, so as to generate a first shifted signal to a modulation circuit output;

a power amplifier including an input coupled to the modulation circuit output, the power amplifier being configured to amplify an intermediate signal on the modulation circuit output and to generate an amplified output signal;

a predistortion-signal-generating circuit configured to generate, from the incident signal and from the amplified output signal in a second bandwidth that is larger than the first bandwidth, a predistortion signal having a second power lower than the first power; and a second modulation circuit configured to perform a second frequency shift on a second signal generated from the predistortion signal using the shift signal, so as to generate a second shifted signal for combination with the first shifted signal at said modulation circuit output to produce the intermediate signal.

14. The device according to claim 13, wherein the incident signal is a digital signal and the predistortion-signal-generating circuit is configured to generate a digital predistortion signal, the device further including:

a first digital-to-analog converter configured to generate, from the digital signal, the first signal to the first modulation circuit, the first digital-to-analog converter having a first input dynamic range and a first sampling frequency;

a second digital-to-analog converter configured to generate, from the digital predistortion signal, the second signal to the second modulation circuit, the second digital-to-analog converter having a second input dynamic range smaller than the first input dynamic range and a second sampling frequency higher than the first sampling frequency.

15. The device according to claim 14, further comprising:

a demodulation circuit configured to downshift a frequency of the amplified output signal using the shift signal; and an analog-digital converter configured to deliver a digital signal from the shifted amplified output signal.

16. The device according to claim 13, wherein the predistortion-signal-generating circuit is configured to generate said predistortion signal so that it compensates for a distortion of the amplified output signal with respect to the incident signal.

17. The device according to claim 13, wherein the predistortion-signal-generating circuit comprises:

a processing circuit configured to determine by automatic learning the predistortion signal; and a signal generator configured to generate the determined predistortion signal.

18. The device according to claim 13, wherein the predistortion-signal-generating circuit includes a feedback loop configured to generate in real-time a correction of the difference between the incident signal and the output signal.

19. The device according to claim 13, wherein the first modulation circuit includes a first mixer and a first buffer amplifier generating the first shifted signal as a current signal on the modulation circuit output, and wherein the second modulation circuit includes a second mixer and a second buffer amplifier generating the second shifted signal as a current signal on the modulation circuit output.

20. The device according to claim 19, wherein said first and second buffer amplifiers respectively each include a plurality of first and second elementary buffer amplifiers that are switchable in parallel on command, with switching control signals configured to control the value of the gain and the bandwidth of the respective modulation circuit.

21. The device according to claim 13, wherein the second power is 100 to 1000 times lower than the first power.

22. The device according to claim 13, wherein the second bandwidth is 3 to 5 times larger than the first bandwidth.

23. The device according to claim 13, wherein said incident signal and said predistortion signal are quadrature signals and have an amplitude modulated at at least ten bits per symbol.

24. The device according to claim 13, wherein said shift signal is a radiofrequency signal.

25. The device according to claim 13, wherein the device is produced in an integrated way in and on a silicon-germanium substrate.

26. The device according to claim 13, wherein the modulation circuit output comprises a three-winding transformer, a first primary winding of which is configured to receive the first shifted signal, a second primary winding of which is configured to receive the second shifted signal, and a secondary winding of which is configured to output said intermediate signal.

27. A radiofrequency-signal transmission system, comprising:
   a transmission chain device, wherein the transmission chain device comprises:
      a signal input configured to receive an incident signal to be transmitted having a first power and a first bandwidth;
      a local oscillator configured to generate a shift signal;
      a first modulator circuit configured to perform a first frequency shift on a first signal generated from the incident signal using the shift signal, so as to generate a first shifted signal to a modulation circuit output;
      a power amplifier including an input coupled to the modulation circuit output, the power amplifier being configured to amplify an intermediate signal on the modulation circuit output and to generate an amplified output signal;
      a predistortion-signal-generating circuit configured to generate, from the incident signal and from the amplified output signal in a second bandwidth that is larger than the first bandwidth, a predistortion signal having a second power lower than the first power; and
      a second modulation circuit configured to perform a second frequency shift on a second signal generated from the predistortion signal using the shift signal, so as to generate a second shifted signal for combination with the first shifted signal at said modulation circuit output to produce the intermediate signal;
   a digital device configured to generate said incident signal on said signal input; and
   an antenna coupled to the output of said power amplifier.

* * * * *